United States Patent
Dyer et al.

(10) Patent No.: US 6,253,222 B1
(45) Date of Patent: Jun. 26, 2001

(54) COMPRESSION OF LIMITED RANGE FLOATING POINT NUMBERS

(75) Inventors: Don W. Dyer, Ft. Collins; Samuel C Sands, Loveland, both of CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/183,046

(22) Filed: Oct. 31, 1998

(51) Int. Cl.[7] .................................. G06F 7/00; G06F 7/38
(52) U.S. Cl. .............................................. 708/203; 708/495
(58) Field of Search ............................ 708/203, 550–551, 708/495–497

(56) References Cited

U.S. PATENT DOCUMENTS

| | | | |
|---|---|---|---|
| 3,835,456 | * 9/1974 | Angelle et al. | 708/203 |
| 4,750,146 | * 6/1988 | Dalqvist et al. | 708/551 |
| 5,325,316 | * 6/1994 | Koshiba | 708/203 |

* cited by examiner

Primary Examiner—Tan V. Mai

(57) ABSTRACT

A high-speed method for the compression and decompression of floating point numbers. The floating point numbers are biased using a predefined value and then stored in compressed format occupying less memory than that of the non-compressed floating point numbers. Decompression of the compressed floating point number follows a reverse process. These techniques are useful with applications in which the numbers to be compressed fall within a given range.

27 Claims, 18 Drawing Sheets

| BIT POSITION | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| ROUND DOWN CONSTANT 510 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 0 | 0 | 0 | 0 | 0 | 0 | 0 |
| ROUND NEAREST CONSTANT 520 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 0 | 0 |
| ROUND UP CONSTANT 530 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 |

FIG.5

| Bit Position | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| LARGEST NON-COMPRESSED NUMBER 410 (1.0=>) | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| ROUND NEAREST CONSTANT 520 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| SUBTRACT ROUND NEAREST CONSTANT 510 FROM LARGEST NON-COMPRESSED NUMBER 410 AS IF BOTH WERE BINARY NUMBERS: | | | | | | | | | | | | | | | | | | | | | | | | | | | | | | | | |
| COMPRESSION BIAS CONSTANT 600 FOR ROUND NEAREST CASE | 0 | 0 | 1 | 1 | 1 | 1 | 0 | 0 | 1 | 0 | 0 | 0 | 0 | 0 | 1 | 1 | 0 | 0 | 0 | 0 | 0 | 0 | 0 | 0 | 0 | 0 | 0 | 0 | 0 | 0 | 0 | 0 |

| BIT POSITION | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| LARGEST NON-COMPRESSED NUMBER 410 1.0=> | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| ROUND DOWN CONSTANT 510 | 0 | 0 | 0 | 0 | 0 | 0 | 0 | 1 | 1 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |

SUBTRACT ROUND DOWN CONSTANT 510 FROM LARGEST NON-COMPRESSED NUMBER 410 AS IF BOTH WERE BINARY NUMBERS:

| DECOMPRESSION BIAS CONSTANT 700 | 0 | 0 | 1 | 1 | 1 | 1 | 0 | 1 | 1 | 0 | 0 | 1 | 0 | 0 | 0 | 1 | 1 | 1 | 1 | 1 | 1 | 1 | 1 | 1 | 1 | 1 | 1 | 1 | 1 | 1 | 1 | 0 |

| BIT POSITION | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| NON-COMPRESSED NUMBER 1200 0.75=> | 0 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| COMPRESSION BIAS CONSTANT 600 FOR ROUND NEAREST CASE | 0 | 0 | 0 | 1 | 1 | 1 | 0 | 1 | 1 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| SUBTRACT COMPRESSION BIAS CONSTANT 600 FROM NON-COMPRESSED NUMBER 1200 AS IF BOTH WERE BINARY NUMBERS ||||||||||||||||||||||||||||||||
| RESULT OF SUBTRACTION | 0 | 0 | 0 | 1 | 0 | 0 | 1 | 0 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 |
| RESULT OF EXTRACTION | | | | | | | 1 | 0 | 1 | 1 | 1 | 1 | 1 | 1 | 1 | | | | | | | | | | | | | | | | | |
| COMPRESSED FLOATING POINT NUMBER REPRESENTATION ~1000 | | | | | | 0 | 1 | 0 | 1 | 1 | 1 | 1 | 1 | 1 | 1 | | | | | | | | | | | | | | | | | |

FIG.12

COMPRESSION OF LIMITED RANGE FLOATING POINT NUMBERS

FIELD OF THE INVENTION

This invention relates generally to number representations and computations in a computer system. More particularly, it relates to the compression and decompression of floating point numbers.

BACKGROUND

Generally, a number used in a computer system requires a memory allocation specified by the operating system. In some cases, it is important to conserve memory by representing that number in a memory space smaller than that which the operating system defines. Such representations are especially valuable in applications that utilize large quantities of data. The process of reducing required memory is referred to as compression, and the opposite function, that of recovering the number to its original format, is called decompression.

Floating point numbers have been compressed using the subtract and multiply instructions to bias, as well as to scale a floating point number so that its value is in a desired range. The resulting floating point number is then converted to an integer. Due to the multiplication instructions, this technique is relatively slow.

Another technique is to separately truncate and store the exponent and the mantissa fields of the floating point number. The algebraic sign bit is also separately stored. Since not all combinations of bits in the compressed format represent floating point numbers in a desired range, the number of bits required is more than necessary. Also, two separate field store operations for compression, as well as two separate field extractions for decompression, are required—one each for the exponent and for the mantissa. There is also a store and a retrieve operation for the algebraic sign.

In order to better meet the dual requirements of reduced memory utilization which permits more data to be loaded into memory and of higher speed which increases application performance, a need exists for further improvements in methods of compressing and decompressing floating point numbers in computer systems.

SUMMARY OF THE INVENTION

Representative embodiments of the present invention present methods for the compression of numbers. In particular, the present patent document relates to methods for the high speed compression and decompression of limited range floating point numbers. Compression of a floating point number converts it to a much smaller representation of the number, and decompression converts a compressed representation of a floating point number back into a regular floating point number whose value is approximately that of the original floating point number, but may have somewhat less precision. Methods used in the present patent document are designed for rapid execution on a computer. For compression, these methods employ the very fast numerical steps of subtraction, extraction, and insertion. While for decompression, these methods employ comparably fast numerical steps of addition, extraction, and insertion.

Compression of floating point numbers is useful for reducing the storage space in computer memory required for either floating point data or any data structures which contain floating point numbers. Compression is also useful for reducing the bandwidth or speed required of a communication pathway to transmit either floating point data or any data structures which contain floating point numbers. Compressed floats may be used directly as data, without decompressing them. Specifically, the compressed float interpreted as an integer may be used as an index into an array. Used as such, it constitutes a rapid method of mapping floating point numbers to values stored in the array.

In a representative embodiment, prior to compression and decompression, six characteristics are either specified or determined: (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, and (6) the compression rounding method. In representative embodiments there are three compression rounding methods: (1) "Round down", (2) "Round to Nearest", and (3) "Round up". The range of numbers to be compressed, referred to herein as the range of compressible numbers, is also specified.

The non-compressed number space and the compressed number space both comprise discrete values with the compressed number space having a lesser precision than the non-compressed number space. Decompressions of compressed numbers return discrete decompressed values in the non-compressed number space. In the "round down" compression rounding method any value in non-compressed number space between two such adjacent decompressed values is rounded down in compressed number space to the smaller or "floor" of the two corresponding adjacent compressed values. In the "round up" compression rounding method any value in non-compressed number space between two such adjacent decompressed values is rounded in compressed number space to the larger or "ceiling" of the two corresponding adjacent compressed values. While, in the "round nearest" compression rounding method any value in non-compressed number space between two such adjacent decompressed values is rounded in compressed number space to the nearest of the two corresponding adjacent compressed values.

Using these six characteristics, constants used in the compression/decompression process, as well as the resulting precision, can be determined.

The floating-point compression process begins by clearing the sign bit to zero. However, if decompression results have mixed signed values, the sign bit is extracted and stored before clearing. Next the compression bias constant, computed in accordance with the teachings of the present patent document, is subtracted from the modified floating-point value. The subtraction is performed as if both values are binary numbers. Such values are referred to herein as fixed-point-format binary numbers. The determined number of bits is extracted from the result and is stored in the compressed floating-point number. When the result of the subtraction is less than or equal to zero, zero is stored. Finally, if decompression results have mixed signed values, the saved floating-point sign bit is stored in the compressed floating-point number.

To decompress, the compressed floating-point value is deposited into a floating-point value. When the non-compressed results include zero and the compressed floating-point number is zero, the decompression process is complete. Otherwise, the decompression bias constant, computed in accordance with the teachings of the present patent document, is added to this value as if both values are binary numbers. Finally, if decompression results have mixed signed values, the compressed floating-point sign bit is stored in the floating-point sign.

Compressed representations of numbers and associated decompressed numbers obtained using methods of representative embodiments enable applications to utilize larger data sets with higher performance than would otherwise be possible without compression. The methods used in these representative embodiments are simple and fast. They can be implemented in special purpose computing hardware with minimal cost and complexity. The methods of the present patent document are applicable to floating point numbers bounded by upper and lower absolute magnitude values.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and:

FIG. 5 is a bit map of compression rounding constants for an illustrative example of a representative embodiment.

FIG. 6 is a bit map showing subtraction of the round nearest constant from the largest non-compress number to obtain a compression bias constant in an illustrative example of a representative embodiment.

FIG. 7 is a bit map showing subtraction of the round down constant from the largest non-compressed number to obtain a decompression bias constant in an illustrative example of a representative embodiment.

FIG. 12 is a bit map of an illustrative numerical example in which a floating point number is compressed according to a representative embodiment.

DETAILED DESCRIPTION OF THE PREFERRED EMBODIMENTS

1. Introduction

Figure 1:
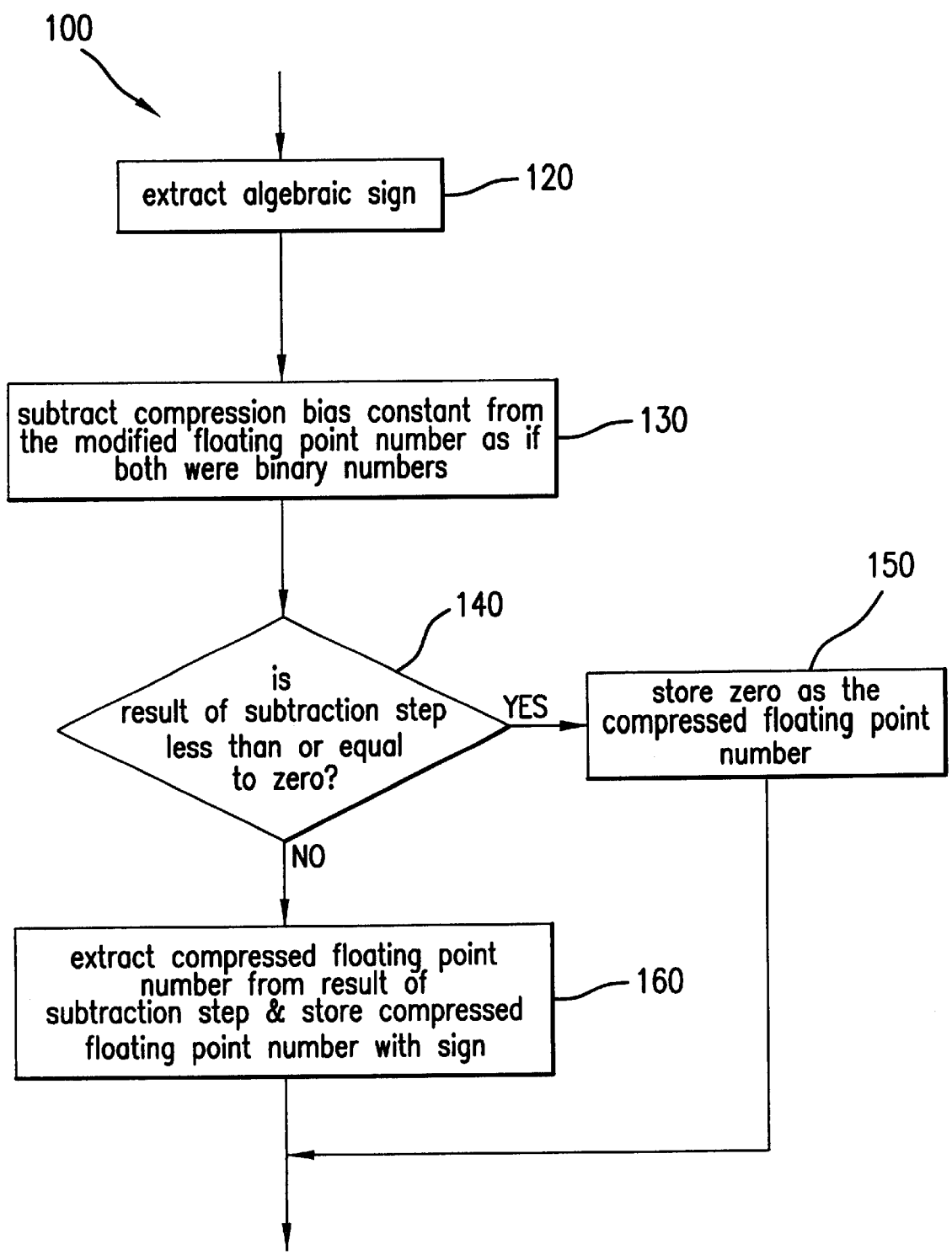
FIG. 1 is a flow chart of an overview of a computer program for compressing a floating point number according to a representative embodiment.

As shown in the drawings for purposes of illustration, the present patent document presents methods for the high speed compression of limited range floating point numbers. Methods used for compression and decompression of floating point numbers always trade off reduction in memory required vs. speed. Methods used in the present patent document are designed for rapid execution on a computer. In the following detailed description and in the several figures of the drawings, like elements are identified with like reference numerals.

Compression of floating point numbers is useful for reducing the storage space in computer memory required for either floating point data or any data structures which contain floating point numbers. Compression is also useful for reducing the bandwidth or speed required of a communication pathway to transmit either floating point data or any data structures which contain floating point numbers. Compressed floating point numbers may be used directly as data, without decompressing them. Specifically, the compressed floating point number, if interpreted as an integer, may be used for data lookup, such as an index into an array. Used as such, it constitutes a rapid method of mapping floating point numbers to values stored in the array.

2. Overview of the Methods

Sections 2.1 and 2.2 provide brief overviews of the representative embodiments for the methods of compression and decompression of floating point numbers. Subsequent sections provide greater detail for these methods.

Prior to compression of a floating point number and related decompression of a compressed representation of the floating point number, several constants need to be computed. Among these constants are a compression bias constant, an extraction bit position, an extraction field which is a field of contiguous bits, and a decompression bias constant. These constants are required for both compression and decompression. They need only be computed once and then stored for future use.

2.1 Overview of Compression

FIG. 1 is a flow chart of a compression software program 100 in which an overview of the method steps of a representative embodiment for the compression of a floating point number are shown. More detail will be provided in the discussion and figures that follow.

When algebraic signs are to be retained as a part of the compressed floating point number, block 120 extracts the value of the floating point sign bit. Block 120 then transfers control to block 130.

Block 130 subtracts the compression bias constant from the floating point number. The subtraction is performed as if both the floating point number and the compression bias constant were binary numbers. Block 130 then transfers control to block 140.

When the result of the subtraction is less than or equal to zero, block 140 transfers control to block 150. Otherwise block 140 transfers control to block 160.

Block 150 stores zero as the compressed floating point number. Block 150 then terminates the software program.

Block 160 uses the extraction bit position and the extraction field in extracting a bit field from the result of the subtraction step for storage in the compressed floating point number. When the algebraic sign of the floating point number is to be stored, block 160 performs that storage. Block 150 then terminates the software program.

2.2 Overview of Decompression

Figure 2:
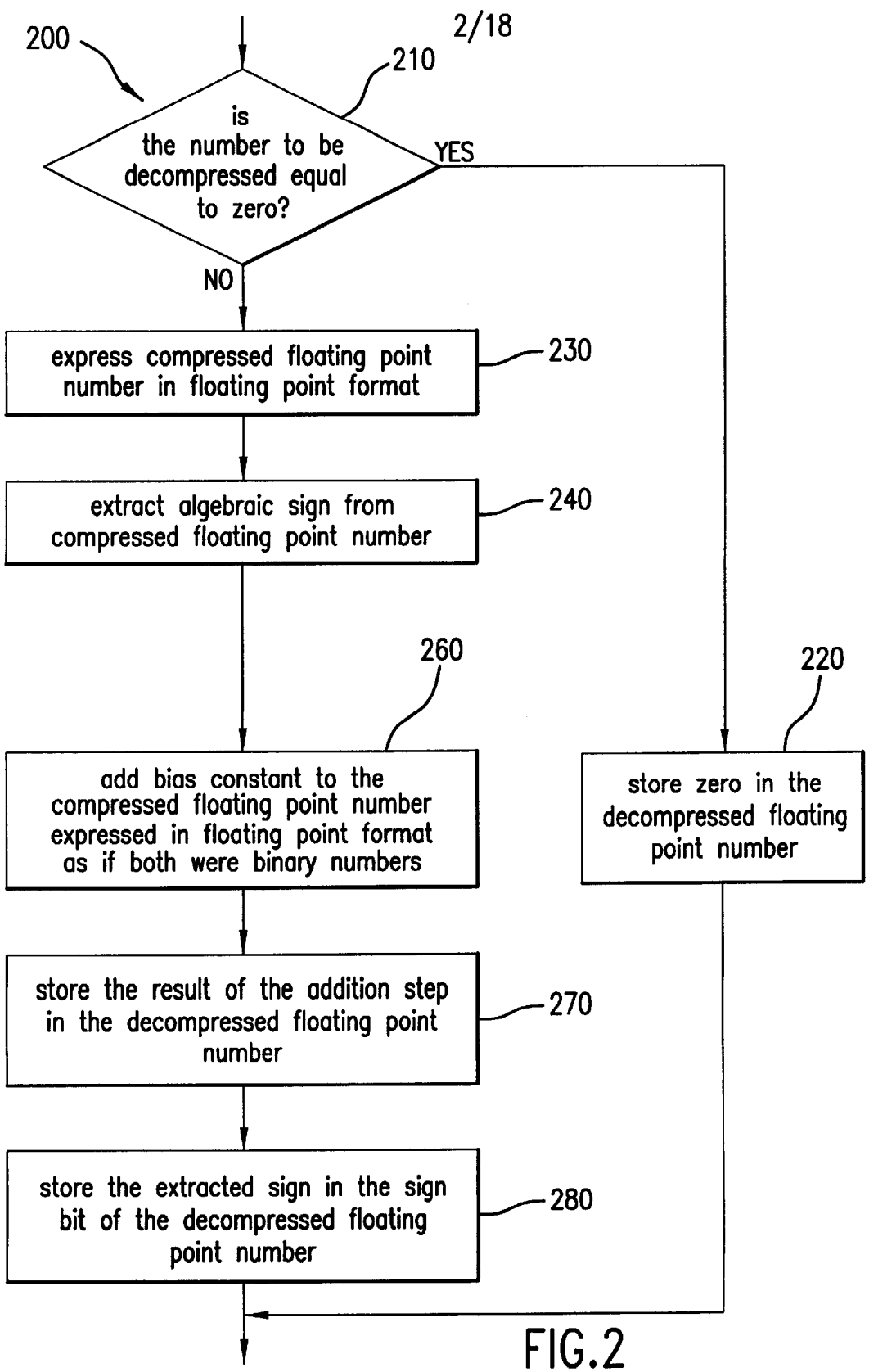
FIG. 2 is a flow chart of an overview of a computer program for decompressing a floating point number according to a representative embodiment.

FIG. 2 is a flow chart of a decompression software program 200 in which an overview of the method steps of a representative embodiment for the compression of a floating point number are shown. More detail will be provided in the discussion and figures that follow.

When the number to be decompressed is zero, block 210 of FIG. 2 transfers control to block 220. Otherwise, block 210 transfers control to block 230.

Block 220 stores zero in the decompressed floating point number. Block 220 then terminates the software program.

Block 230 expresses the compressed floating point number in floating point format. Block 230 then transfers control to block 240.

When algebraic signs are retained as a part of the compressed floating point number, block 240 extracts the value of the floating point sign bit from the compressed floating point number. Block 240 then transfers control to block 260.

Block 260 adds the decompression bias constant to the compressed floating point number expressed in floating point format. The addition is performed as if both the compressed floating point number expressed in floating point format and the decompression bias constant were binary numbers. Block 260 then transfers control to block 270.

Block 270 stores the result of the addition step in the decompressed floating point number. Block 270 then transfers control to block 280.

When algebraic signs are retained as a part of the compressed floating point number, block 280 stores the extracted algebraic sign in the sign bit of the decompressed floating point number. Block 280 then terminates the software program.

3. Floating Point Format

The conventional representation, as specified by the IEEE 754 standard, for a fixed point number in computer systems will be used in the present patent document to point out the features of representative embodiments. However, this floating point number representation is used for illustrative purposes only. The methods of compression/decompression are not limited to this particular representation.

Figure 3:
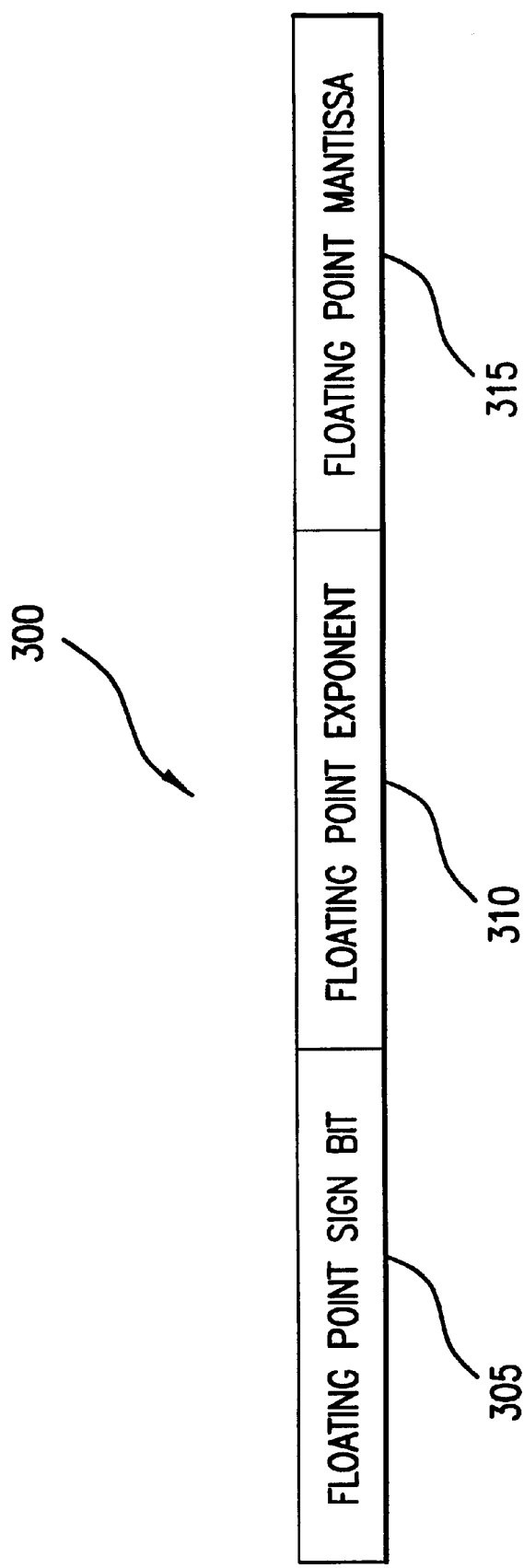
FIG. 3 is a drawing of a segment of computer memory for storing a floating point number.

FIG. 3 shows a segment of memory for a number 300 represented as a floating-point-format number 300 in single precision format, also referred to herein as a floating point number 300, as defined in the IEEE 754 standard. The floating point number 300 occupies 32-bits divided into a floating point sign bit 305, eight (8) bits for a floating point exponent 310, and 23 bits for a floating point mantissa 315. To construct the floating-point-format number 300 of a fixed point number, first the whole and fractional parts of the fixed point number are separately converted to binary numbers and combined while maintaining the location of the decimal point. The leading "1" of the binary number is then placed to the left of the decimal point and the binary number is multiplied by the appropriate exponent. In order to store only positive values in the floating point exponent 310, the integer 127 is added to the value of the floating point exponent 310. Only the fractional part of the mantissa is stored in the floating point mantissa 315, as the leading "1" of the binary representation is always present except when the number is zero, in which case the binary number consists of all zeros.

4. Compression and Decompression Setup

In a representative embodiment, prior to compression and decompression, six characteristics are either specified or determined: (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, (6) the compression rounding method used. In representative embodiments there are three compression rounding methods: (1) "Round down", (2) "Round to Nearest", and (3) "Round up". The range of numbers to be compressed, referred to herein as the range of compressible numbers, is also specified.

The three compression rounding methods indicated above are explained in detail in section 4.7.

4.1 Compressed Representation Size

The number of binary digits in the compressed representation directly controls the precision of the compressed floating-point value. Selecting smaller number of digits increases value compression while larger number of digits provides increased precision. In an illustrative example, 9 digits of value have been chosen.

4.2 Decompression Sign

If the decompressed values include mixed signs, wherein the decompressed numbers include both positive and negative values, then an additional sign bit is allocated in the compressed number. When decompressed values are of the same sign, the sign may be added as a constant to the value during the decompression step. For the example, mixed sign values will be used. As such, the total number of binary digits in the compressed representation is 10.

4.3 Decompression of Zero

Zero in the decompression values is handled differently from other values. When the compressed representation is zero, the decompressed value is also zero and the decompression algorithm is not used. When, however, zero is not in the decompression range, the test for zero can be eliminated. For the representative implementation, zero will be in the decompressed range.

4.4 Largest Non-Compressed Number

The largest non-compressed number is the largest absolute value to be compressed. This number is used in determining the compression and decompression bias constants. The largest number returned from decompression is also this number. For the representative example, 1.0 is the largest non-compressed number.

4.5 Smallest, Non-Zero Non-Compressed Number

The smallest, non-zero non-compressed number is a number selected by the user to be the smallest, non-zero absolute value that will be compressed. It is used in computing the compression and decompression bias constants. Due to the loss of precision in the compression/decompression processes the value recovered from decompression will only approximate that which was compressed. The actual value recovered is also dependent upon the compression rounding method chosen. To maximize precision while also maximizing compression, the smallest, non-zero non-compressed number should be chosen to be as close to the largest compressed representation as possible.

4.6 Extraction Constant

Figure 4:
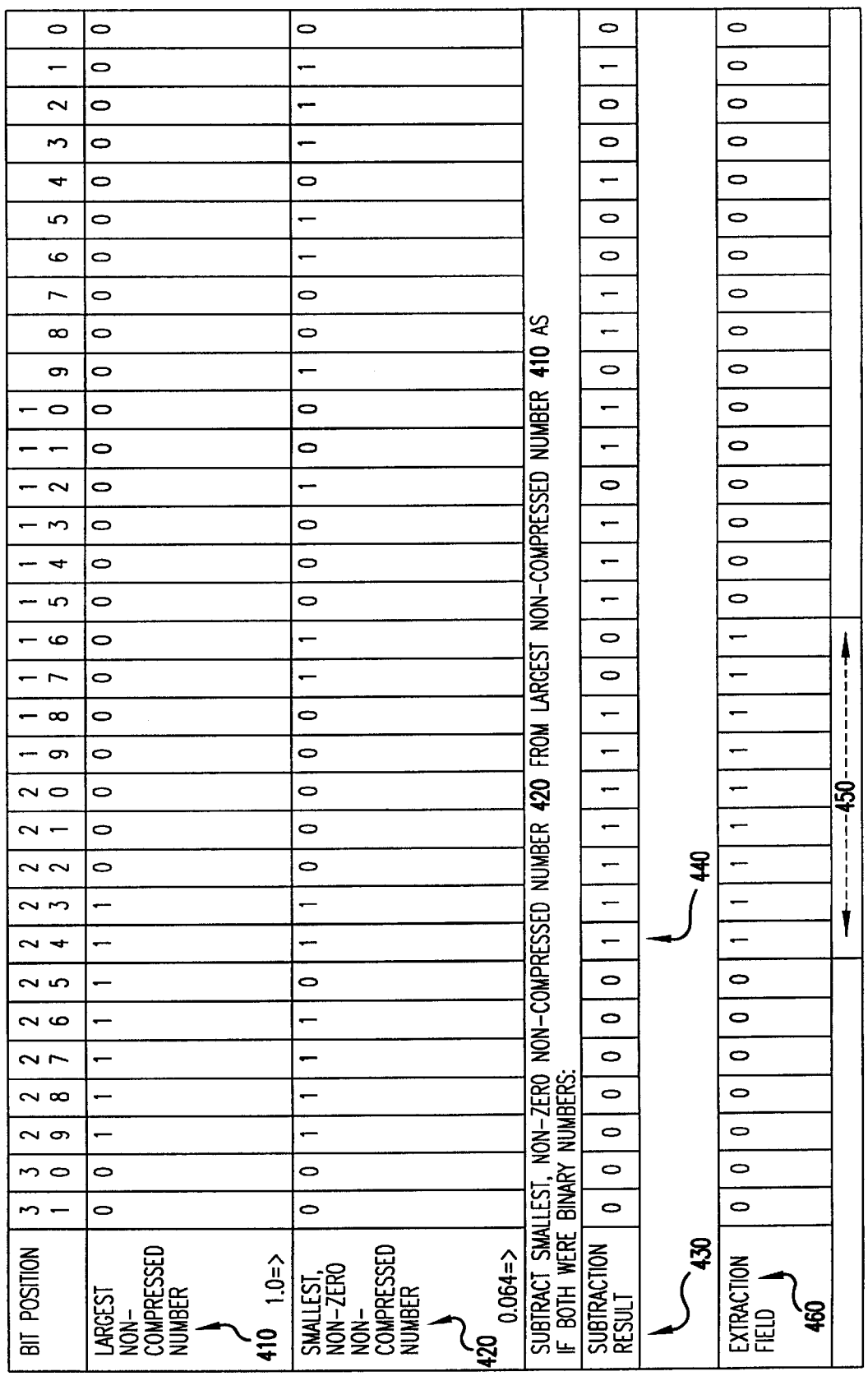
FIG. 4 is a bit map of numbers for an illustrative example of an extraction or insertion bit position for a representative embodiment.

FIG. 4 is a bit map of numbers for the illustrative example. The top line of FIG. 4 indicates the bit position of the floating point numbers shown below the top line. The second line is the floating point representation of a largest non-compressed number 410, which for the illustrative example is fixed point 1.0 and treated as a binary number is 0x3F800000. The third line is the floating point representation of a smallest, non-zero non-compressed number 420, which for the illustrative example is fixed point 0.064 and treated as a binary number is 0x3D851EB8. The fourth line is a subtraction result 430, also referred to as a difference value 430, which for the illustrative example has a binary value of 0x1FAE148. The position of the highest non-zero bit resulting from the subtraction of the smallest, non-zero non-compressed number 420 from the largest non-compressed number 410 as if both values are binary numbers is an extraction bit position 440, also referred to herein as an insertion bit position 440. In the illustrative example, the extraction bit position 440 is 0x1000000 or bit position 24. Also shown is a compressed representation field size 450 which for the illustrative example is 9 bits. Since the compressed representation field size 450 is 9 bits, the compressed representation field size 450 aligned with the extraction bit position 440 is 0x1FF0000. An extraction field 460 which results from the subtraction is shown in line five. Line five consists of one's beginning in the extraction bit position 440 and extending to the right for the compressed representation field size 450. In the illustrative example, these bits are extracted from non-compressed numbers to construct the corresponding compressed representations.

4.7 Compression Rounding Method

Finally, the compression rounding method should be chosen. The non-compressed number space and the compressed number space both comprise discrete values with the compressed number space having a lesser precision than the non-compressed number space. Decompressions of compressed numbers return discrete decompressed values in the non-compressed number space. In the "round down" compression rounding method any value in non-compressed number space between two such adjacent compressed values is rounded down in compressed number space to the smaller or "floor" of the two corresponding adjacent compressed representations. In the "round up" compression rounding method any value in non-compressed number space between two such adjacent compressed values is rounded in compressed number space to the larger or "ceiling" of the two corresponding adjacent compressed representations. While, in the "round nearest" compression rounding method any value in non-compressed number space between two such adjacent compressed values is rounded in compressed number space to the nearest of the two corresponding adjacent compressed representations. The rounding method has no performance impact on compression or decompression.

FIG. 5 is a bit map of compression rounding constants for the illustrative example. In the example, a compression rounding constant 500 is obtained by one of three compression rounding methods: (1) the "round down" method obtains a round down constant 510 in which the value to be compressed is rounded down to a compressed representation in the compression domain, (2) the "round nearest" method obtains a round nearest constant 520 in which the value to be compressed is rounded to the nearest value available in the compression domain, and (3) the "round up" method obtains a round up constant 530 in which the value to be compressed is rounded up a compressed representation in the compression domain.

For the "round nearest" method, the compression rounding constant 500 is the round nearest constant 520 which is the extraction bit position 440 filled to the right with ones for the compressed representation field size 450 plus one. For the "round down" method, the compression rounding constant 500 is the round down constant 510 which is the extraction bit position 440 filled to the right with ones for the compressed representation field size 450. For the "round up" method, the compression rounding constant 500 is the round up constant 530 which is the extraction bit position 440 filled to the right with ones to the end.

The construction and use other compression rounding constants 500 is also possible. In particular, any value between that of the round down constant 510 and that of the round up constant 530 could be used.

4.8 Compression and Decompression Bias Constants

In the illustrative example, FIG. 6 is a bit map showing subtraction, as binary numbers, of the compression rounding constant 500, which for the illustrative example is the round nearest constant 520, from the largest non-compressed number 410. The result of this subtraction is a compression bias constant 600. The compression rounding constant 500 used in this step is based upon the rounding method specified.

As an example, for the illustrative example, using the "round nearest" method, the round nearest constant 520 has one plus the number of bits in the extraction field 460, in this example 10 bits, filled with ones beginning at the extraction bit position 440 and extending toward the least significant bit, or 0x1FF8000. Subtracting this value from the largest non-compressed number as binary numbers gives a compression bias constant 600 of 0x3D808000 (0x3F800000−0x1FF8000=0x3D808000).

In the example, FIG. 7 is a bit map showing subtraction, as binary numbers, of the compression rounding constant 500, which is the round down constant 510, from the largest non-compressed number 410. The result of this subtraction is a decompression bias constant 700. To obtain the decompression bias constant 700, the subtraction always uses the round down constant 510. For this illustrative example, the decompression rounding constant 500 has the number of bits in the extraction field 460, in this example 9 bits, filled with ones beginning at the extraction bit position 440 and extending toward the least significant bit, or 0x1FF0000. Subtracting this value from the largest non-compressed number 410 as binary numbers gives a decompression bias constant 700 of 0x3D810000.

4.9 Review of Steps for Computing Compression and Decompression Bias Constants

Figure 8:
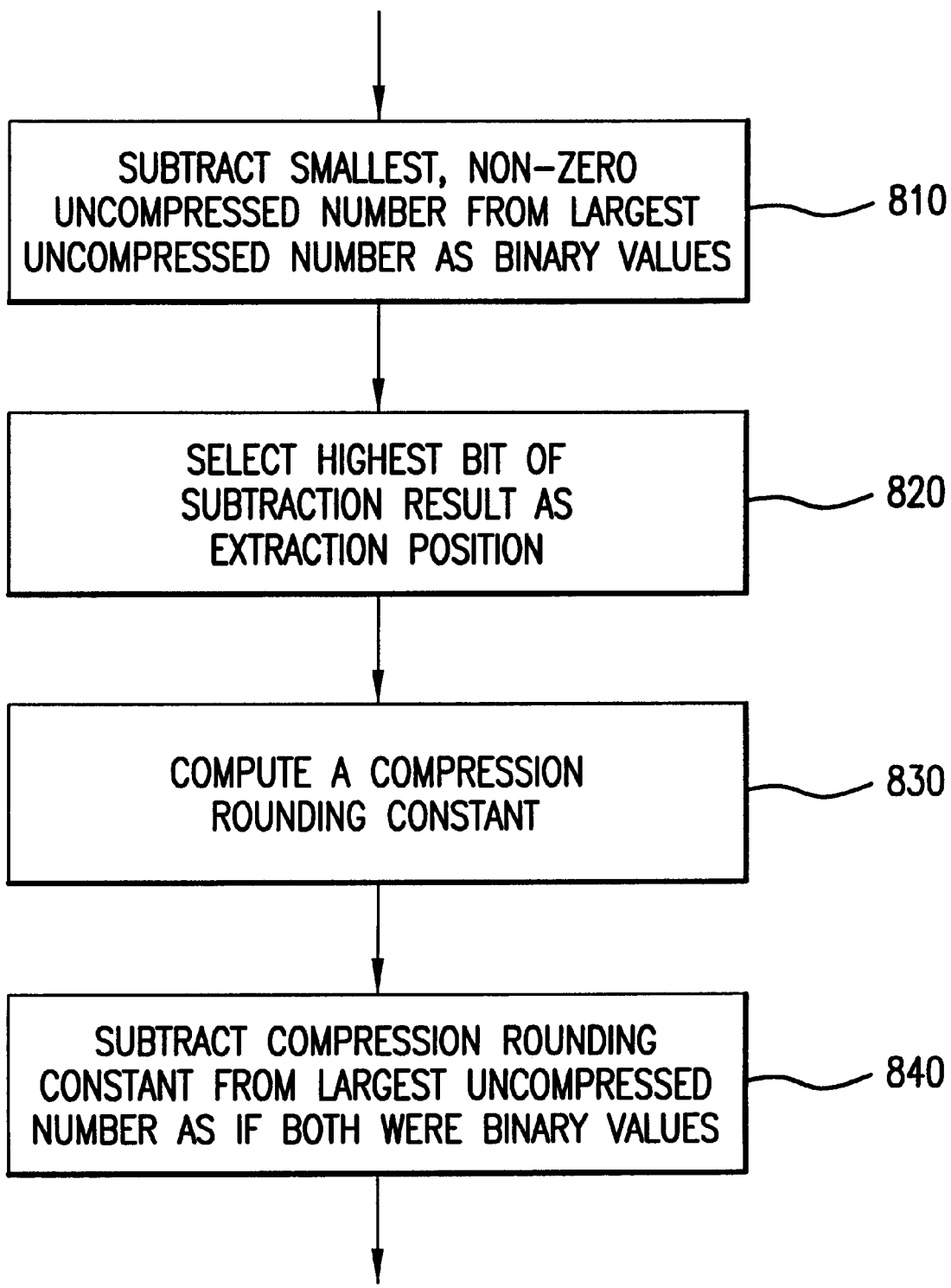
FIG. 8 is a flow chart of the method used to compute the compression bias constant in a representative embodiment.

Refer to FIG. 8 for a flow chart of the method used to compute the compression bias constant 600 in a representative embodiment.

Block 810 subtracts the smallest, non-zero non-compressed number 420 from the largest non-compressed number 410 as if both numbers were binary numbers. Block 810 then transfers control to block 820.

Block 820 selects the highest bit of the result of the subtraction step as the extraction bit position 440. Block 820 then transfers control to block 830.

Block 830 computes the compression rounding constant 500 based upon whether the "round down", "round nearest", or "round up" method has been chosen. Block 830 then transfers control to block 840.

Block 840 subtracts the compression rounding constant 500 from the largest non-compressed number 410 as if both numbers were binary numbers to obtain the compression bias constant 600.

Figure 9:
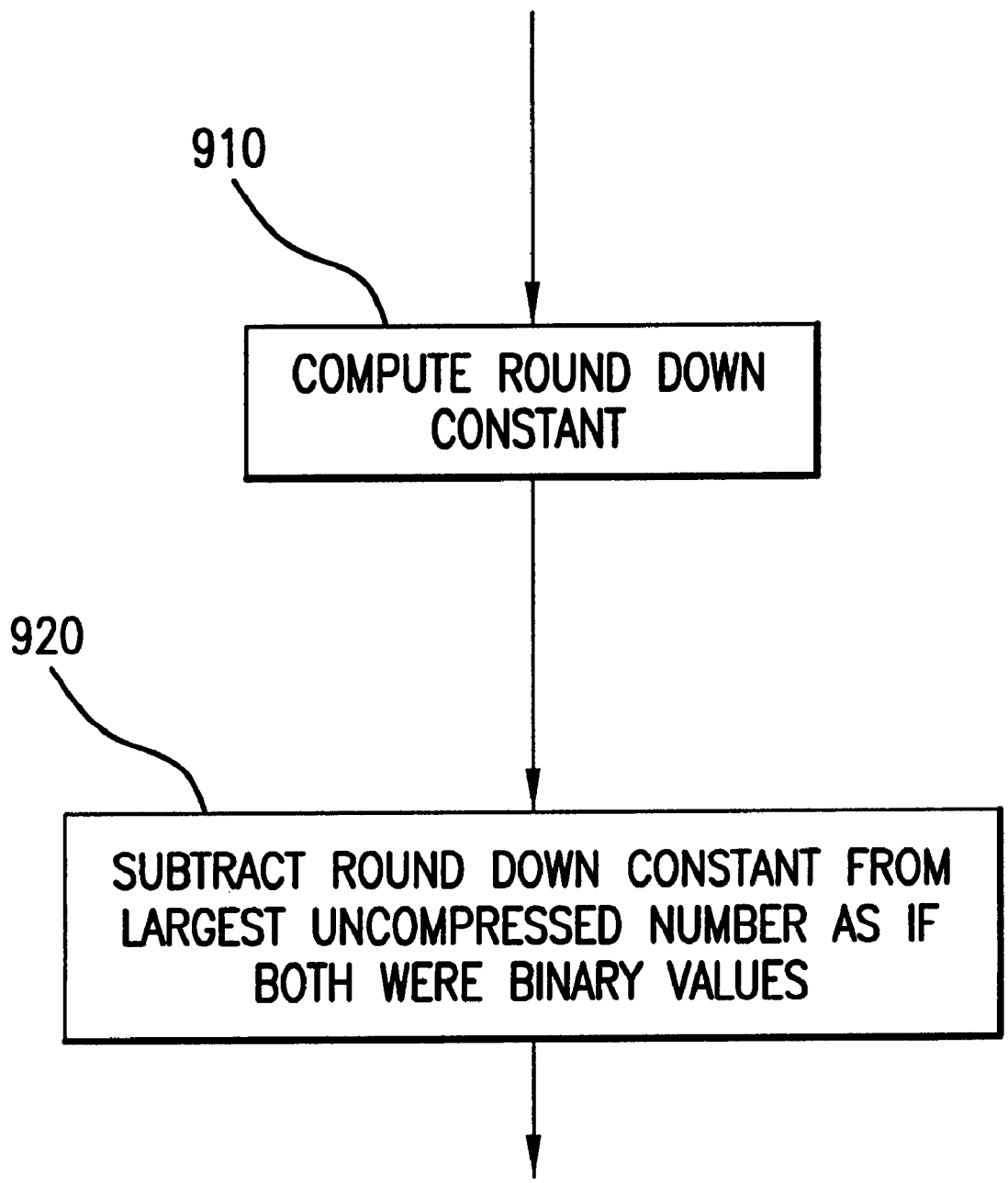
FIG. 9 is a flow chart of the method used to compute the decompression bias constant in a representative embodiment.

Refer to FIG. 9 for a flow chart of the method used to compute the decompression bias constant 700 in a representative embodiment.

Using the extraction bit position 440 previously obtained, block 910 computes the round down constant 510. Block 910 then transfers control to block 920.

Block 920 subtracts the round down constant 510 from the largest non-compressed number 410 as if both numbers were binary numbers to obtain the decompression bias constant 700.

5. Compression

Figure 10:
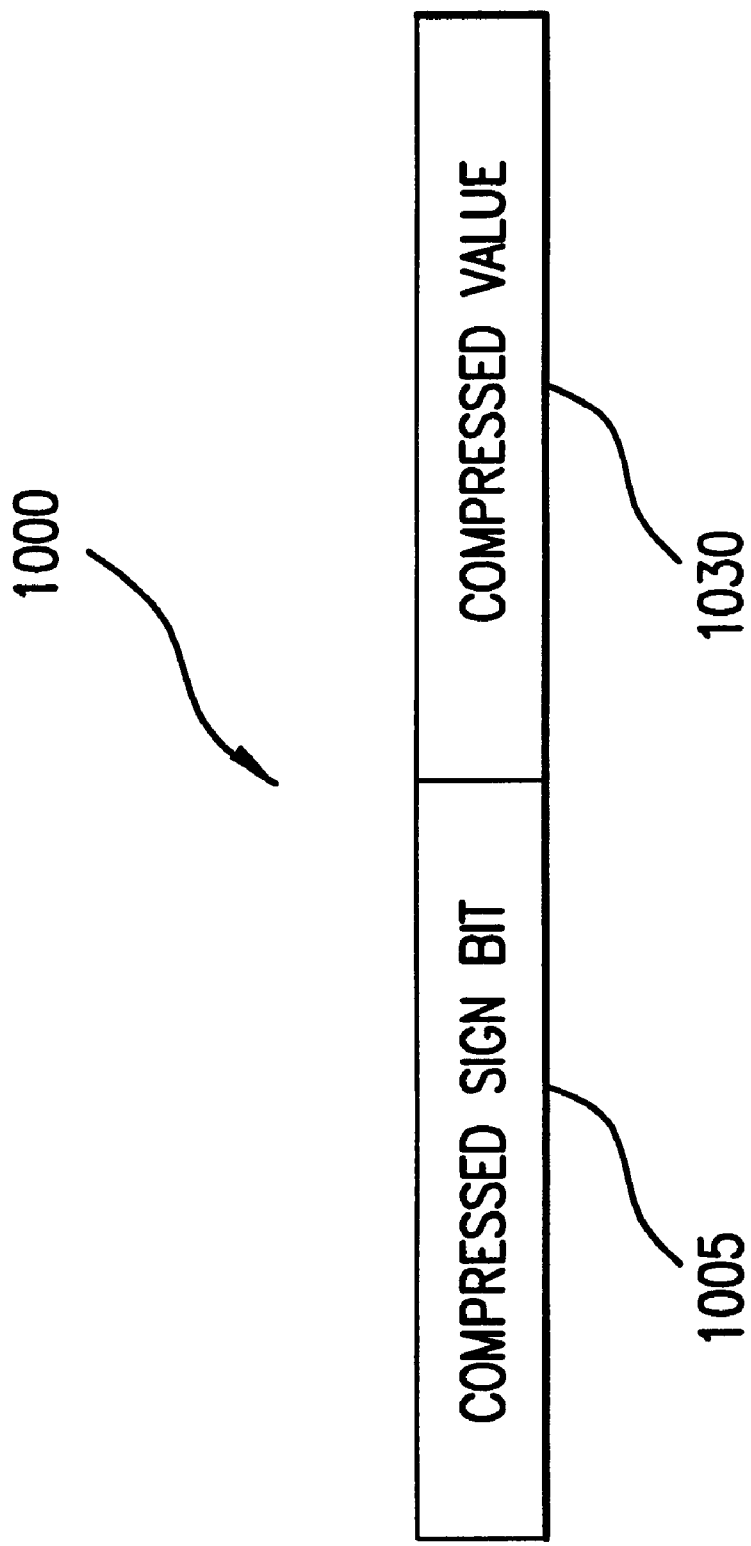
FIG. 10 is a drawing of a segment of computer memory for storing a compressed floating point number.

FIG. 10 is a drawing of a segment of memory for a compressed floating point number representation 1000, also referred to herein as a compressed floating point number 1000, of the floating point number which, as an example, could be stored in computer memory as indicated by the floating-point-format number 300 of FIG. 3. In the illustrative example, the compressed floating point number 1000 occupies 10-bits divided into a compressed sign bit 1005 and nine bits for a compressed representation 1030.

Figure 11:
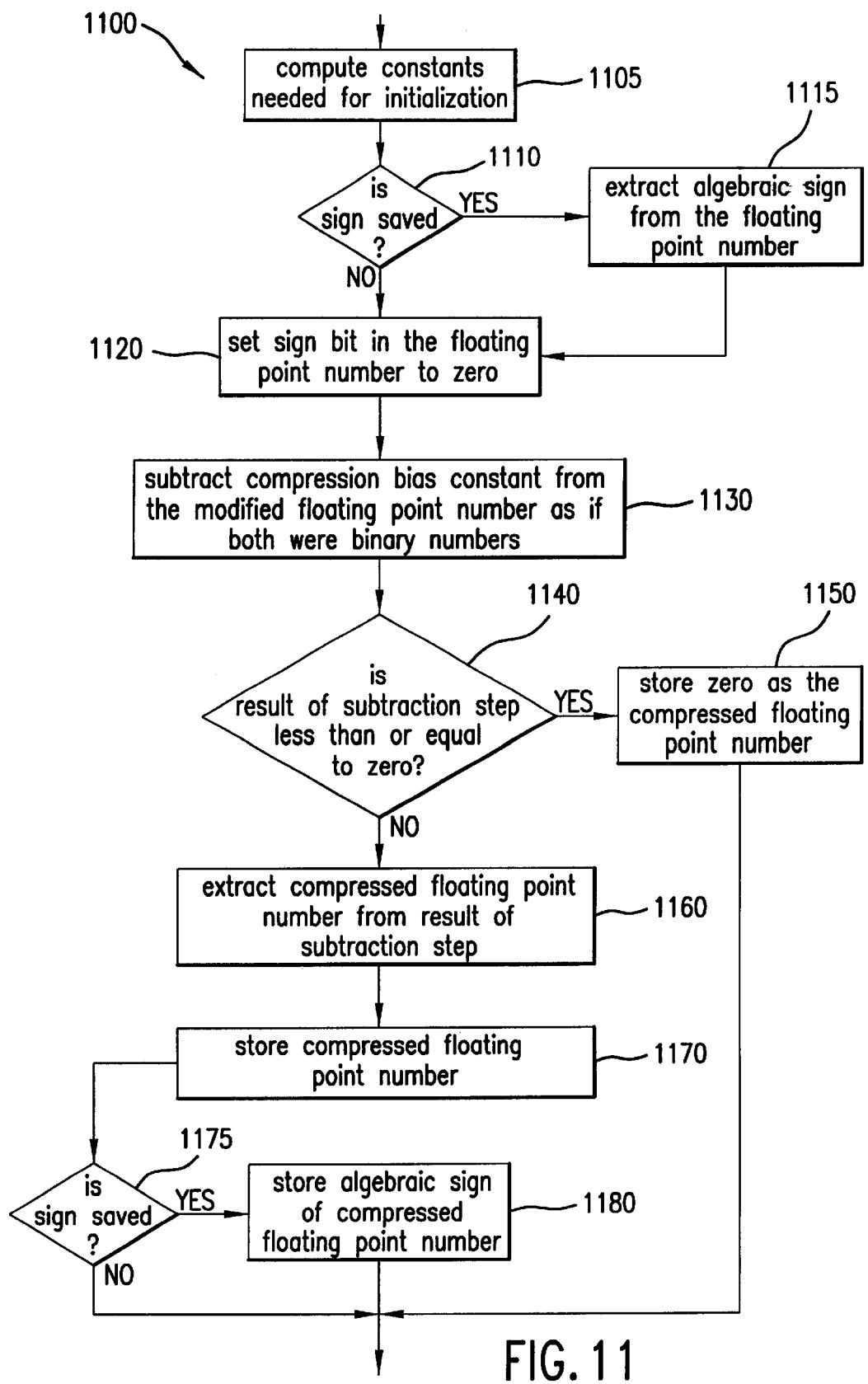
FIG. 11 is a flow chart of a computer program for compressing a floating point number according to a representative embodiment.

FIG. 11 is a flow chart of a compression software program 1100 in which the method steps of a representative embodiment for the compression of a floating point number are shown. Block 1105 of FIG. 11 performs the computations previously described to obtain values for the extraction bit position 440, the compression rounding constant 500, the round down constant 510 when needed, the round nearest constant 520 when needed, the round up constant 530 when needed, and the compression bias constant 600. Block 1105 then transfers control to block 1110.

When the sign of the floating point number is to be saved, block 1110 transfers control to block 1115. Otherwise, block 1115 transfers control to block 1120.

Block 1115 extracts the value of the floating point sign bit 305 from the floating-point-format number 300. Block 1115 then transfers control to block 1120.

Block 1120 sets the floating point sign bit 305 to zero. Block 1120 then transfers control to block 1130.

Referring to both FIG. 11 and FIG. 6, Block 1130 subtracts the compression bias constant 600 from the floating-point-format number 300 as modified in block 1120. This subtraction step involves treating both the compression bias constant 600 and the floating-point-format number 300 both as pure binary numbers, ignoring any distinction between the sign bits, exponents, and mantissas. Block 1130 transfers control to block 1140.

When the result of the subtraction step of block 1130 is less than or equal to zero, block 1140 transfers control to block 1150. Otherwise, block 1130 transfers control to block 1160.

Block 1150 stores zero in the compressed floating point number 1000. Block 1150 then terminates the compression software program 1100.

Block 1160 extracts the compressed representation 1030 from the result of the subtraction of block 1130 which for the illustrative example is the 9 bits including and just to the right of the extraction point 440. Block 1160 then transfers control to block 1170.

Block 1170 stores the value of the compressed representation 1030 extracted in block 1160 in the compressed floating point number 1000. Block 1170 then transfers control to block 1175.

When the algebraic sign of the floating-point-format number 300 is to be saved, block 1175 transfers control to block 1180. Otherwise, block 1175 terminates the compression software program 1100.

Block 1180 stores the value of the floating point sign bit 305, extracted in block 1115, in the compressed sign bit 1005 of the compressed floating point number 1000. Block 1180 then terminates the compression software program 1100.

FIG. 12 is a bit map of an illustrative numerical example in which a floating point number is compressed according to a representative embodiment. In this figure, the compression bias constant 600 for the round nearest case is subtracted from the non-compressed number 1200 which has a decimal value of 0.75. For the illustrative example, the 9 bits just to the right of and including the extraction point 440 are extracted and stored in the compressed representation 1030 of the compressed floating point number 1000 and the compressed sign bit 1005 is set.

6. Decompression

Figure 13:
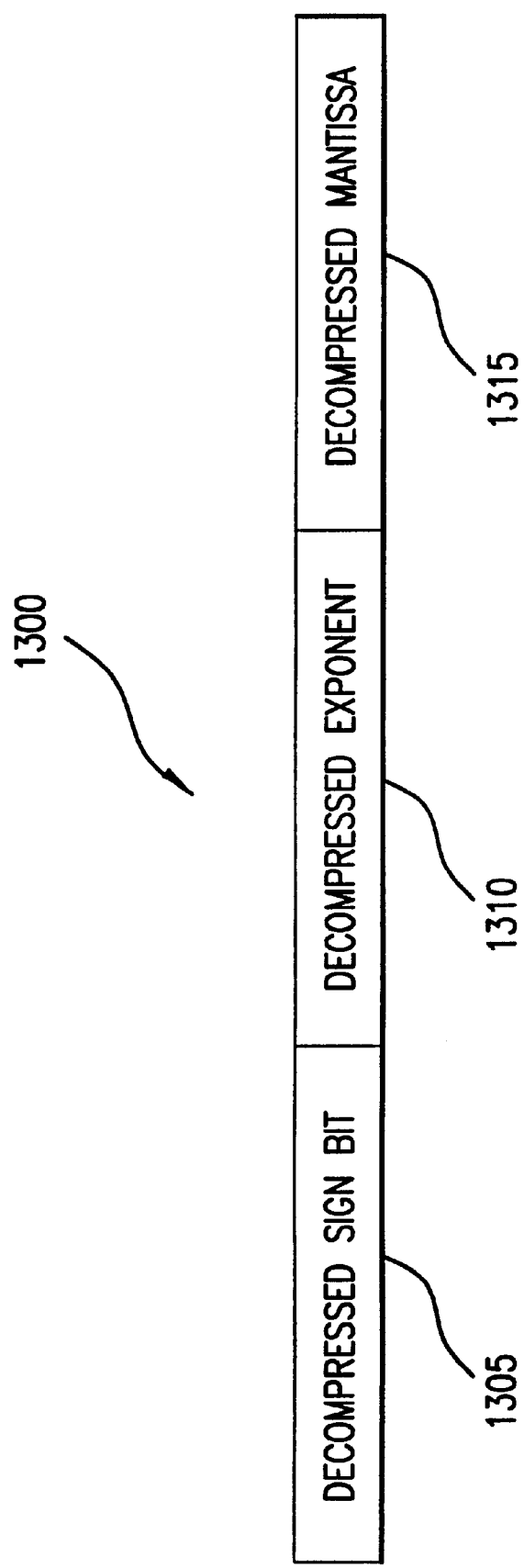
FIG. 13 is a drawing of a segment of computer memory for storing a decompressed floating point number.

FIG. 13 is a drawing of a segment of memory for storing a decompressed-floating-point-format number 1300, also referred to herein as a decompressed floating point number 1300, of the value of the floating-point-format number 300 of FIG. 3. In a representative embodiment, the decompressed floating point representation 1300 occupies memory space equivalent to that of the floating-point-format number 300 which in the example is 32-bits divided into a decompressed sign bit 1305, eight (8) bits for a decompressed exponent 1310, and 23 bits for a decompressed mantissa 1315.

Figure 14:
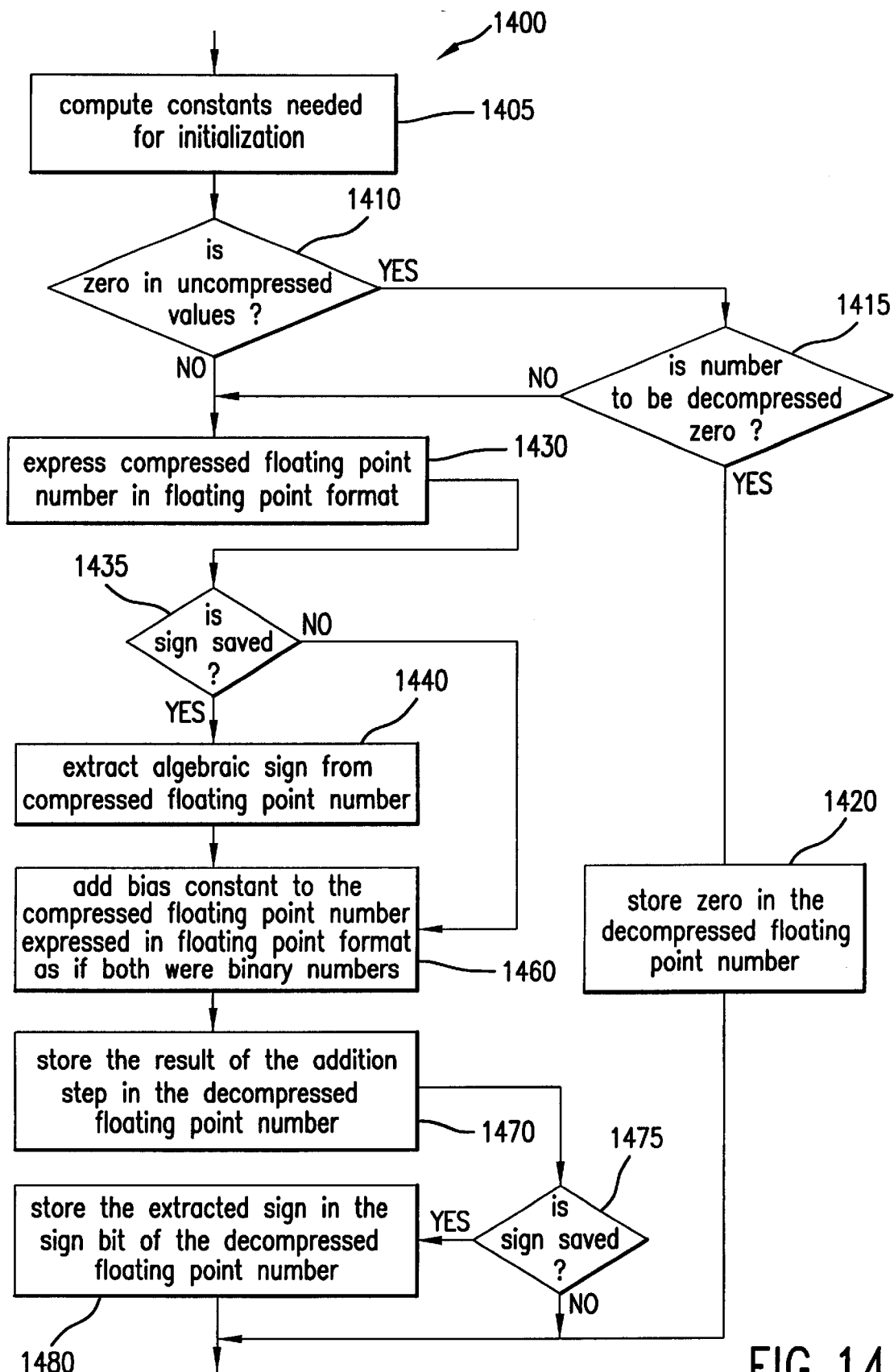
FIG. 14 is a flow chart of a computer program for decompressing a compressed representation of a floating point number according to a representative embodiment.

FIG. 14 is a flow chart of a decompression software program 1400 in which the method steps of a representative embodiment for the decompression of a compressed representation of a floating point number are shown.

Block 1405 of FIG. 14 performs the computations previously described to obtain values for the extraction bit position 440, the compression rounding constant 500, the round down constant 510, and the decompression bias constant 700. Block 1405 then transfers control to block 1410.

When the value zero can be a value of the decompressed floating point number 1300, block 1410 transfers control to block 1415. Otherwise, block 1410 transfers control to block 1430.

When the compressed floating point number 1000 is equal to zero, block 1415 transfers control to block 1420. Otherwise, block 1415 transfers control to block 1430.

Block 1420 stores a zero in the decompressed floating point number 1300 and terminates the decompression software program 1400.

Block 1430 expresses the compressed floating point number 1000 in the decompressed floating point number 1300 by copying the compressed representation 1030 into the decompressed floating point representation 1300 at and to the right of the insertion point 440. All other bits in the decompressed floating point number 1300 are set to zero. Block 1430 then transfers control to block 1435.

If the floating point sign bit 305 of the floating-point-format number 300 was saved in the compressed sign bit 1005, block 1435 transfers control to block 1440. Otherwise, block 1435 transfers control to block 1460.

Block 1440 extract the compressed sign bit 1005 from the compressed floating point number 1000. Block 1440 then transfers control to block 1460.

Block 1460 adds the decompression bias constant 700 to the compressed floating point number 1000 expressed in floating point format as if both were binary numbers. Block 1460 then transfers control to block 1470.

Block 1470 stores the result of the addition of block 1460 in the decompressed floating point number 1300. Block 1470 then transfers control to block 1475.

If the floating point sign bit 305 of the floating-point-format number 300 was saved in the compressed sign bit 1005, block 1475 transfers control to block 1480. Otherwise, block 1475 terminates the program.

Block 1480 stores the algebraic sign extracted in block 1440 from the compressed floating point number 1000 in the decompressed sign bit 1305 of the decompressed floating point number 1300. Block 1480 then terminates the decompression software program 1400.

Figure 15:
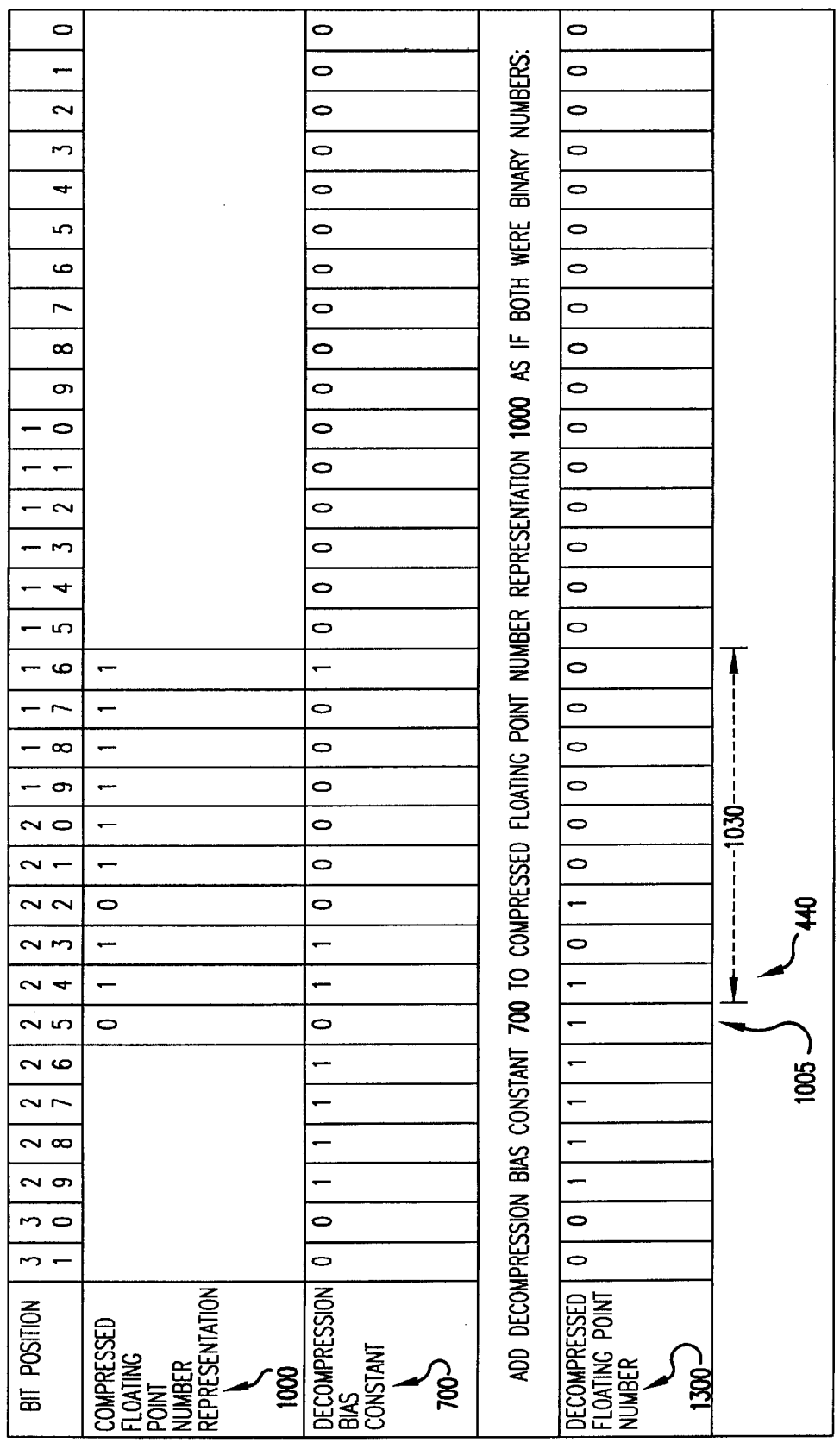
FIG. 15 is a bit map of an illustrative numerical example in which a compressed number is decompressed into a floating point number according to a representative embodiment.

FIG. 15 is a bit map of an illustrative numerical example in which a compressed number is decompressed into a floating point number according to a representative embodiment. In this figure, the decompression bias constant 700 is added to the compressed floating point number 1000. For the illustrative example prior to the addition, the compressed floating point number 1000 with its sign bit cleared is aligned with the decompression bias constant 700 such that the leftmost bit of the compressed floating point number 1000 is just to the left of the extraction point 440. Setting the sign bit of this addition results in the decompressed floating point number 1300 which has a recovered decimal value of 0.75. Note that the value of the decompressed floating point number 1300 will not always be exactly equal to the value of the non-compressed number 1200 due to a lack of precision in the compression/decompression process.

7. Computer System

Figure 16:
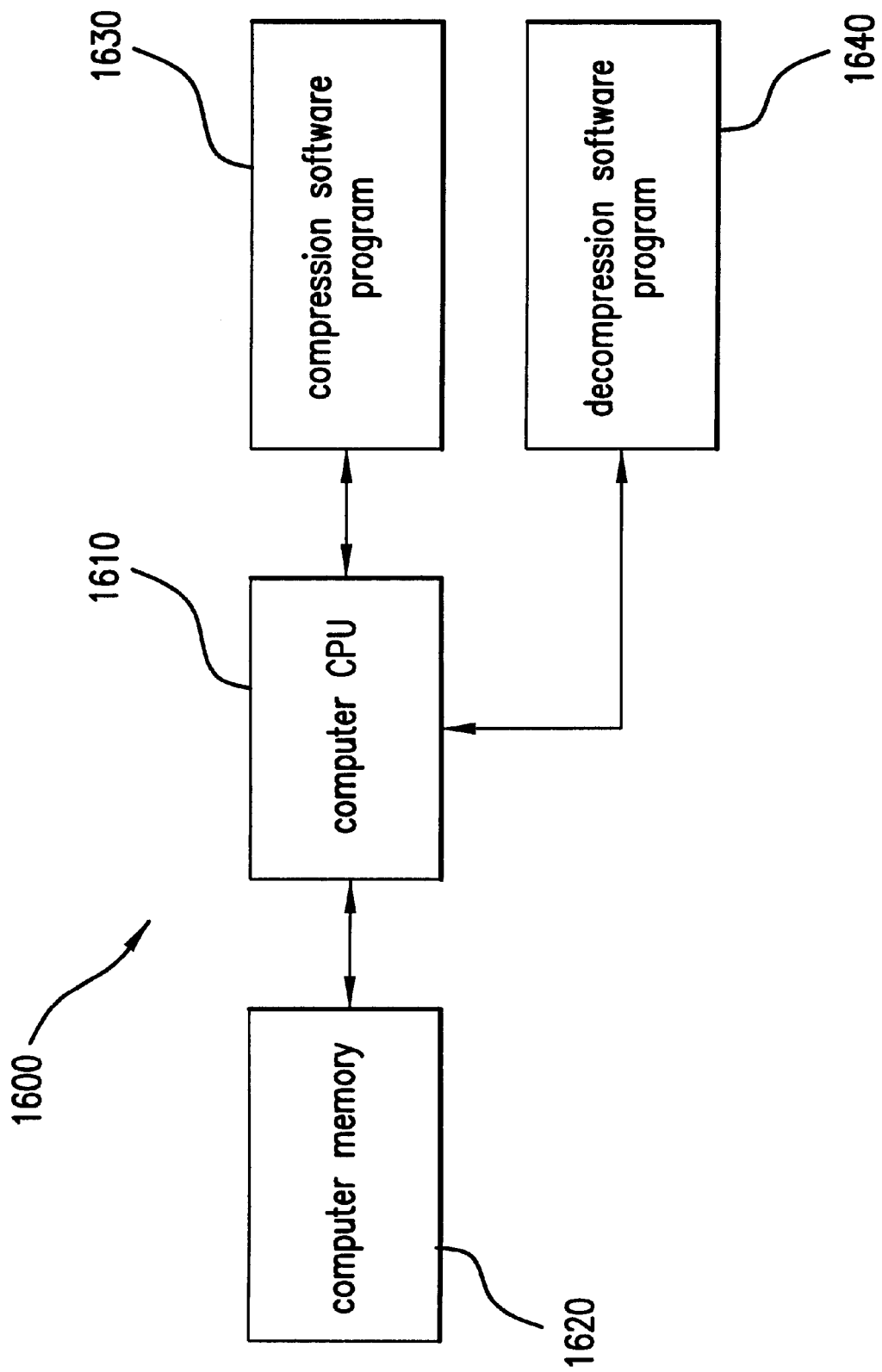
FIG. 16 is a drawing of a computer system for compressing and decompressing floating point numbers according to a representative embodiment.

FIG. 16 is a drawing of a computer system 1600 for compressing and decompressing the value of the floating-point-format number 300. The computer system 1600 consists of a computer central processing unit 1610, also referred to herein as a computer CPU 1610, to which is connected a computer memory 1620, also referred to herein as a memory 1620. A compression software program 1630 running on the computer CPU 1610 compresses the floating-point-format number 300 into the compressed floating point number 1000. The decompression software program 1640 decompresses the compressed floating point number 1000 into the decompressed floating point number 1300.

8. Hardware Representative Implementation—Compression

In addition to implementation as a software program or procedure, representative embodiments of the compression and decompression methods of the present patent document could be implemented in hardware, as for example in an accelerator chip. In such embodiments, floating-point-format numbers 300 could be transferred to the hardware implementation from an application or driver program or from additional upstream hardware in the process flow.

Figure 17:
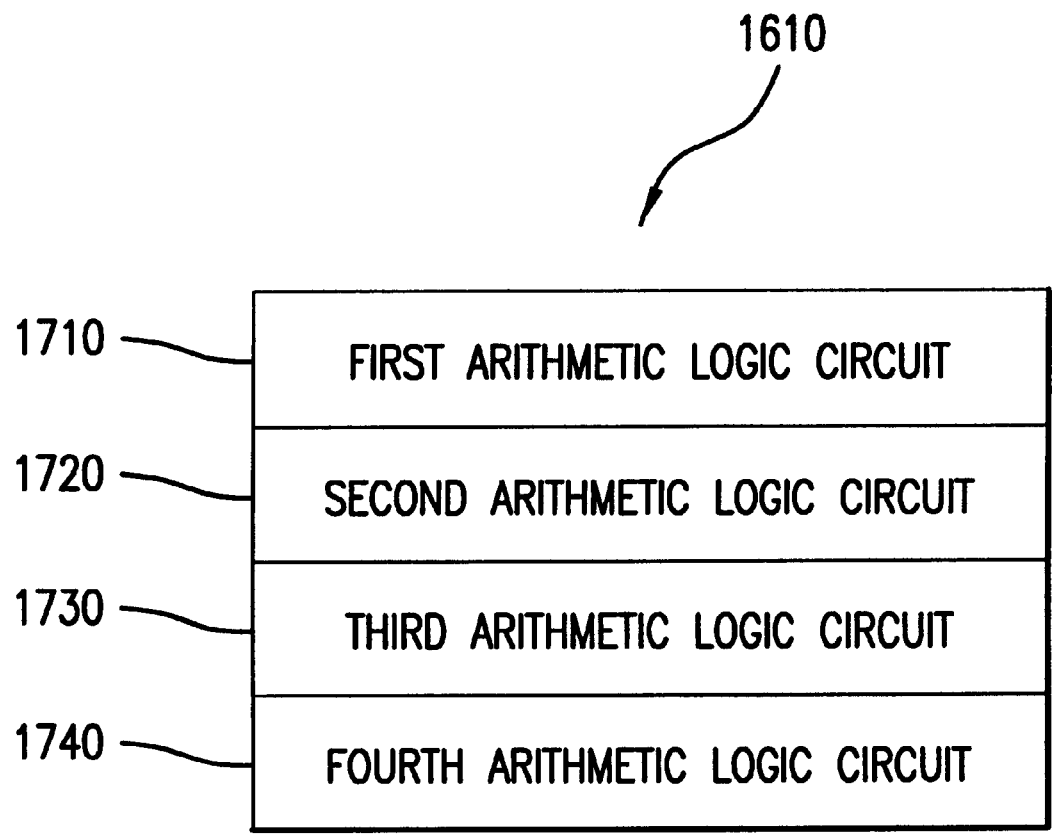
FIG. 17 is a drawing of a hardware embodiment for compressing a floating point number according to a representative embodiment.

FIG. 17 is a drawing of a hardware implementation for compressing a floating-point-format number 300 according to a representative embodiment. In this embodiment, several constants are either specified or computed. In practice, they are specified or computed prior to the compression of the floating-point-format number 300 into the compressed representation 1030, but the following discussion does not always follow that order. For a given implementation these constants need to be specified or computed only once and then stored, for example in a register, for future use. These constants include (1) the number of binary digits used in the compressed representation, (2) whether or not decompression results have mixed signed values, (3) whether or not decompression results include zero, (4) the largest uncompressed absolute value, (5) the smallest, non-zero non-compressed absolute value, and (6) the compression rounding method. Also in various representative embodiments, there are three compression rounding methods: (1) "Round down", (2) "Round to Nearest", and (3) "Round up".

In FIG. 17, arithmetic logic circuits in the computer CPU 1610 of the computer system 1600 are used to compress the floating-point-format number 300 into the compressed representation 1030 and store the compressed representation 1030 in the memory 1620 of the computer system 1600. The computer CPU 1610 comprises a first arithmetic logic circuit 1710 configured to access data from the memory 1620 of the computer system 1600 for accessing the floating-point-format number 300 stored in the memory 1620, a second arithmetic logic circuit 1720 configured to take an absolute value of a number, a third arithmetic logic circuit 1730 configured to subtract one number from another, and a fourth arithmetic logic circuit 1740 configured to copy data from one location in the memory 1620 to another.

When the floating-point-format number 300 is less than zero, the second arithmetic logic circuit 1720 takes an absolute value of the floating-point-format number 300. Also when the floating-point-format number 300 is less than zero, the third arithmetic logic circuit 1730 subtracts a specified compression bias constant 600 from the absolute value of the floating-point-format number 300 to obtain a difference value 430, wherein the subtraction is performed in a manner that treats the compression bias constant 600 and the absolute value of the floating-point-format number 300 as though they were both fixed-point-format binary numbers. Otherwise, the third arithmetic logic circuit 1730 subtracts the compression bias constant 600 from the floating-point-format number 300 to obtain a difference value 430, wherein the subtraction is performed in a manner that treats the compression bias constant 600 and the floating-point-format number 300 as though they were both fixed-point-format binary numbers.

When the difference value 430 is less than or equal to zero, a fourth arithmetic logic circuit 1740 configured to copy data from one location in the memory 1620 to another copies zero into the compressed representation 1030.

When the difference value 430 is greater than zero, the fourth arithmetic logic circuit 1740 copies into the compressed representation 1030 a field of contiguous bits within the difference value 430, such that the number of bits in the field of contiguous bits is equal to a specified compressed representation field size 450, the bit position of the most significant bit in the field of contiguous bits corresponds to a specified extraction bit position 440 in the difference value 430, and the most significant bit of the compressed representation 1030 corresponds to the most significant bit of the field of contiguous bits.

When algebraic signs are stored, the fourth arithmetic logic circuit 1740 copies a sign bit 1005 into the memory 1620 associated with the compressed representation 1030, wherein the sign bit 1005 is equal to the sign of the floating-point-format number 300.

In a representative embodiment, the extraction bit position 440 is specified as in the following. This computation does not need to be performed more than once for a given implementation. The third arithmetic logic circuit 1730 subtracts the smallest, non-zero non-compressed number 420 from a largest non-compressed number 410, wherein the largest non-compressed number 410 is the absolute magnitude of the specified largest floating-point-format number 300 in the domain of floating-point-format numbers 300 specified to be compressed. And the fourth arithmetic logic circuit 1740 further copies the bit position number of the most significant bit in the result of the subtraction of the smallest, non-zero non-compressed number 420 from the largest non-compressed number 410 which contains a one into the extraction bit position 440.

In a representative embodiment, the compression bias constant 600 is specified as in the following. This computation does not need to be performed more than once for a given implementation. The third arithmetic logic circuit 1730 subtracts a specified floating-point-format compression rounding constant 500 from a largest non-compressed number 410, wherein the largest non-compressed number 410 is the absolute magnitude of the largest-floating-point-format number 300 in the domain of the floating-point-format numbers 300 specified to be compressed, wherein the subtraction is performed in a manner that treats the compression rounding constant 500 and the largest non-compressed number 410 as though they were both fixed-point-format binary numbers. And the fourth arithmetic logic circuit 1740 copies the result of the subtraction of the floating-point-format compression rounding constant 500 from the largest non-compressed number 410 into the compression bias constant 600.

In a representative embodiment, the compression rounding constant 500 is specified to be the round down constant 510 which is computed as in the following. This computation does not need to be performed more than once for a given implementation. The fourth arithmetic logic circuit 1740 copies, beginning with the extraction bit position 440 in the compression rounding constant 500 and extending toward the least significant bit, a one into each of the corresponding contiguous compressed representation field size 450 bits. And the fourth arithmetic logic circuit 1740 copies zeros into all other bit positions of the compression rounding constant 500.

In another representative embodiment, the compression rounding constant 500 is specified to be the round nearest constant 510 which is computed as in the following. This computation does not need to be performed more than once for a given implementation. The fourth arithmetic logic circuit 1740 further copies, beginning with the extraction bit position 440 in the compression rounding constant 500 and extending toward its least significant bit, a one into each of the corresponding contiguous compressed representation field size 450 plus one bits. And the fourth arithmetic logic circuit 1740 copies zeros into all other bit positions of the compression rounding constant 500.

In still another representative embodiment, the compression rounding constant 500 is specified to be the round up constant 510 which is computed as in the following. This computation does not need to be performed more than once for a given implementation. The fourth arithmetic logic circuit 1740 further copies, beginning with the extraction bit position 440 in the compression rounding constant 500 and extending to its least significant bit, a one into each of the corresponding contiguous bits. And the fourth arithmetic logic circuit 1740 copies zeros into all other bit positions of the compression rounding constant 500.

9. Hardware Representative Implementation—Decompression

Figure 18:
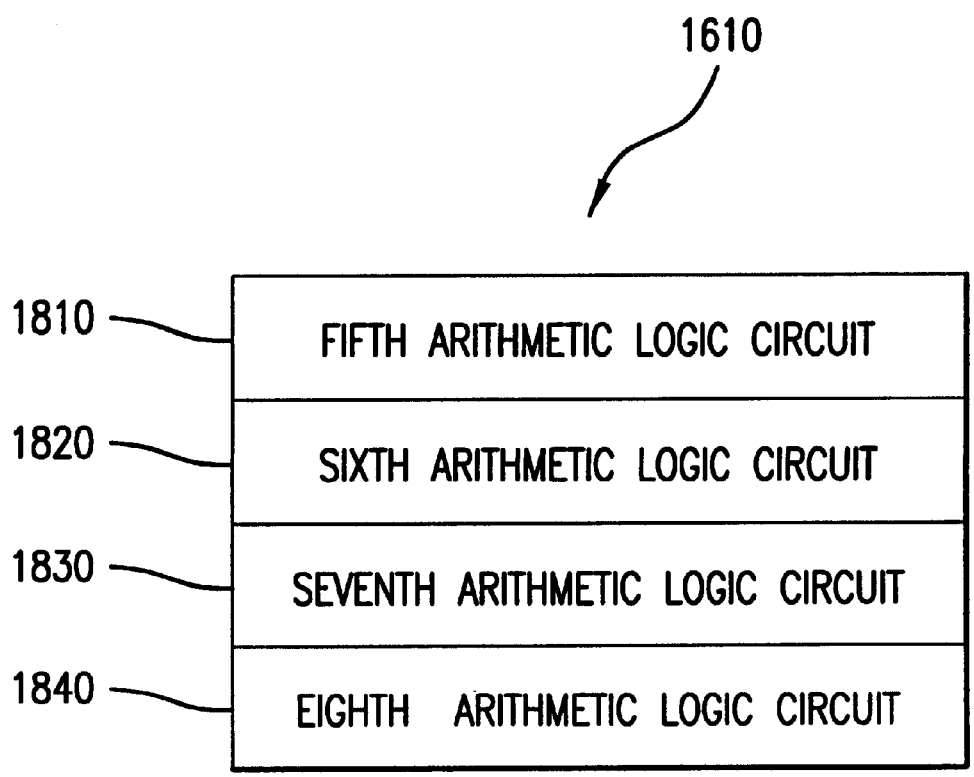
FIG. 18 is a drawing of a hardware embodiment for decompressing a compressed representation of a floating point number according to a representative embodiment.

FIG. 18 is a drawing of a hardware implementation for decompressing a compressed representation of a floating point number according to a representative embodiment. In a representative embodiment, arithmetic logic circuits in the computer CPU 1610 of the computer system 1600 are used to decompress a decompressed-floating-point-format number 1300 from the compressed representation 1030 of the floating-point-format number 300 stored in a memory 1620. In this embodiment, several constants are either specified or computed prior to decompression. In practice, they are specified or computed prior to the compression of the floating-point-format number 300 into the compressed representation 1030, but the following discussion does not always follow that order. For a given implementation these constants need to be specified or computed only once and then stored, for example in a register, for future use. These constants include (1) the number of binary digits used in the compressed representation, (2) whether or not decompression results have mixed signed values, (3) whether or not decompression results include zero, (4) the largest non-compressed absolute value, (5) the smallest, non-zero non-compressed absolute value, and (6) the compression rounding method.

In FIG. 18, the computer CPU 1610 comprises a fifth arithmetic logic circuit 1810 configured to access data from the memory 1620 of the computer system 1600 for accessing the compressed representation 1030 stored in the memory 1620, a sixth arithmetic logic circuit 1820 configured to copy data from one location in the memory 1620 to another, a seventh arithmetic logic circuit 1830 configured to add one number to another, and an eighth arithmetic logic circuit 1840 configured to subtract one number from another.

When the compressed representation 1030 is zero and when zero lies in a domain of floating-point-format numbers 300 specified to be compressed, the sixth arithmetic logic circuit 1820 copies zero into the decompressed-floating-point-format number 1300.

Otherwise, the sixth arithmetic logic circuit 1820, beginning with the most significant bit in the compressed representation 1030, copies the compressed representation 1030 into the decompressed-floating-point-format number 1300 beginning at a specified insertion bit position 440 in the decompressed-floating-point-format number 1300 and extending toward the least significant bit in the decompressed-floating-point-format number 1300. The sixth arithmetic logic circuit 1820 further copies zero into all other bits in the decompressed-floating-point-format number 1300.

The seventh arithmetic logic circuit 1830 adds a specified decompression bias constant 700, wherein the decompression bias constant 700 is in floating point representation; to the decompressed-floating-point-format number 1300, wherein the adding step is performed in a manner that treats the decompression bias constant 700 and the decompressed-floating-point-format number 1300 as though both are fixed-point-format binary numbers.

When algebraic signs are stored, the sixth arithmetic logic circuit 1820 copies, into the decompressed-floating-point-format number 1300 sign bit, a sign bit 1005 stored in the memory 1620 associated with the compressed representation 1030.

The eighth arithmetic logic circuit 1840 configured to subtract one number from another subtracts the smallest, non-zero non-compressed number 420 from a specified largest non-compressed number 410, wherein the largest non-compressed number 410 is the absolute magnitude of the largest floating-point-format number 300 in the domain of floating-point-format numbers 300 to be compressed. And the sixth arithmetic logic circuit 1820 further copies, into the insertion bit position 440, the number of the largest significant bit position in the result of subtracting the smallest, non-zero non-compressed number 420 from the largest non-compressed number 410 which contains a one.

The sixth arithmetic logic circuit 1820 copies, beginning with the insertion bit position 440 in a compression rounding constant 500, wherein the compression rounding constant 500 is in floating point format, and extending toward the least significant bit, a one in each of a corresponding contiguous specified compressed representation field size 450 bits, wherein the compressed representation field size 450 is the number of bits in the compressed representation 1030. And the sixth arithmetic logic circuit 1820 further copies zeros into all other bit positions of the compression rounding constant 500. The eighth arithmetic logic circuit 1840 further subtracts the compression rounding constant 500 from a specified largest non-compressed number 410, wherein the largest non-compressed number 410 is the absolute magnitude of the largest floating-point-format number 300 in the domain of floating-point-format numbers 300 to be compressed, to determine a difference value 430, wherein the subtracting step is performed in a manner that treats the compression rounding constant 500 and the largest non-compressed number 410 as though they were both fixed-point-format binary numbers. And the sixth arithmetic logic circuit 1820 copies the result of subtracting the compression rounding constant 500 from the largest non-compressed number 410 into the decompression bias constant 700.

10. Closing Discussion

A primary advantage of the embodiments described herein over prior techniques is the compression of floating-point-format numbers 300 rapidly and, in some cases, without significant loss of fidelity. Compressed floating point numbers 1000 allow applications to utilize larger data sets with high performance. The representative methods are simple and fast. They can be implemented in hardware with minimal cost and complexity, and with essentially full performance.

Decompressed values can be constructed in CPU local, very high speed memory (registers) which also reduces memory accesses. Also, the representative embodiments are very fast and is easy to implement since the only arithmetic functions utilized are binary subtraction and addition which are relatively fast on most computers.

Although specific embodiments of the invention have been described and illustrated, the invention is not to be limited to the specific forms or arrangements of parts so described and illustrated.

What is claimed is:

1. A computer-implemented method for creating and storing in a memory a compressed representation of a number, comprising the steps of:

specifying a compression bias constant;

accessing the number, wherein the number has values in a pre-specified range of compressible numbers;

subtracting the compression bias constant from the number; and storing a pre-specified extraction field of contiguous bits from the results of the subtracting step.

2. The method of claim 1, providing the compression bias constant and the number are expressed as floating-point-format numbers.

3. A computer-implemented method for creating and storing in a memory a compressed representation of a number, comprising the steps of:

specifying an extraction bit position;

specifying a compression bias constant;

accessing the number, wherein the number has values in a pre-specified range of compressible numbers;

assigning memory to a compressed representation, wherein the number of bits in the compressed representations is equal to a previously specified compressed representation field size;

when the number is less than zero,
  determining an absolute value of the number, and
  subtracting the compression bias constant from the absolute value of the number to obtain a difference value, wherein the subtracting step is performed in a manner that treats the compression bias constant and the absolute value of the number as though they were both fixed-point-format binary numbers, otherwise,
  subtracting the compression bias constant from the number to obtain the difference value, wherein the subtracting step is performed in a manner that treats the compression bias constant and the number as though they were both fixed-point-format binary numbers; and when the difference value is less than or equal to zero, storing zero in the compressed representation, otherwise,
  storing in the compressed representation a field of contiguous bits within the difference value, such that the number of bits in the field of contiguous bits is equal to the compressed representation field size, the bit position of the most significant bit in the field of contiguous bits corresponds to the extraction bit position in the difference value, and the most significant bit of the compressed representation corresponds to the most significant bit of the field of contiguous bits.

4. The method of claim 3, providing the extraction bit position is a bit position in floating-point-format numbers, and providing the compression bias constant and the number are expressed as floating-point-format numbers.

5. The method of claim 3, further comprising the steps of:

storing the algebraic sign bit of the number as a compressed sign bit.

6. The method of claim 3, wherein the method step specifying the extraction bit position comprises the steps of:

specifying a largest non-compressed number, wherein the largest non-compressed number is the absolute magnitude of the largest number in the range of compressible numbers;

identifying a smallest, non-zero non-compressed number, wherein within the range of compressible numbers the smallest, non-zero non-compressed number is the absolute magnitude of the smallest number which is non-zero;

subtracting the smallest, non-zero non-compressed number from the largest non-compressed number; and setting the extraction bit position equal to the bit position of the most significant bit which contains a one in the result of the method step of subtracting the smallest, non-zero non-compressed number from the largest non-compressed number.

7. The method of claim 3, wherein the method step specifying the compression bias constant comprises the steps of:

specifying a largest non-compressed number, wherein the largest non-compressed number is the absolute magnitude of the largest vector component in the range of compressible numbers;

specifying a compression rounding constant, wherein the compression rounding constant is comprised of the same number of bits as the number;

subtracting the compression rounding constant from the largest non-compressed number, wherein the subtracting step is performed in a manner that treats the compression rounding constant and the largest non-compressed number as though they were both fixed-point-format binary numbers; and in the compression bias constant, placing the result of the method step of subtracting the compression rounding constant from the largest non-compressed number.

8. The method of claim 7, wherein the method step specifying the compression rounding constant comprises the steps of:

beginning with the extraction bit position in the compression rounding constant and extending toward the least significant bit, placing a one in each of the corresponding contiguous compressed representation field size bits; and placing zeros in all other bit positions of the compression rounding constant.

9. The method of claim 7, wherein the method step specifying the compression rounding constant comprises the steps of:

beginning with the exaction bit position in the compression rounding constant and extending toward its least significant bit, placing a one in each of the corresponding contiguous compressed representation field size plus one bits; and placing zeros in all other bit positions of the compression rounding constant.

10. The method of claim 7, wherein the method step specifying the compression rounding constant comprises the steps of:

beginning with the extraction bit position in the compression rounding constant and extending to its least significant bit, placing a one in each of the corresponding contiguous bits; and placing zeros in all other bit positions of the compression rounding constant.

11. A computer program storage medium readable by a computer, tangibly embodying a computer program of instructions executable by the computer to perform method steps for creating and storing in a memory a compressed representation of a number, the steps comprising:

specifying a compression bias constant;

accessing the number, wherein the number has values in a pre-specified range of compressible numbers;

subtracting the compression bias constant from the number; and storing a pre-specified extraction field of contiguous bits from the results of the subtracting step.

12. The computer program storage medium of claim 11, providing the compression bias constant and the number are expressed as floating-point-format numbers.

13. A computer program storage medium readable by a computer, tangibly embodying a computer program of instructions executable by the computer to perform method steps for creating and storing in a memory a compressed representation of a number, the steps comprising:

specifying an extraction bit position;

specifying a compression bias constant;

accessing the number, wherein the number has values in a pre-specified range of compressible numbers;

assigning memory to a compressed representation, wherein the number of bits in the compressed representations is equal to a previously specified compressed representation field size;

when the number is less than zero,
determining an absolute value of the number, and
subtracting the compression bias constant from the absolute value of the number to obtain a difference value, wherein the subtracting step is performed in a manner that treats the compression bias constant and the absolute value of the number as though they were both fixed-point-format binary numbers, otherwise,
subtracting the compression bias constant from the number to obtain the difference value, wherein the subtracting step is performed in a manner that treats the compression bias constant and the number as though they were both fixed-point-format binary numbers; and when the difference value is less than or equal to zero,
storing zero in the compressed representation,
otherwise,
storing in the compressed representation a field of contiguous bits within the difference value, such that the number of bits in the field of contiguous bits is equal to the compressed representation field size, the bit position of the most significant bit in the field of contiguous bits corresponds to the extraction bit position in the difference value, and the most significant bit of the compressed representation corresponds to the most significant bit of the field of contiguous bits.

14. The computer program storage medium of claim 13, providing the extraction bit position is a bit position in floating-point-format numbers, and providing the compression bias constant and the number are expressed as floating-point-format numbers.

15. The computer program storage medium of claim 13, the steps further comprising:

storing the algebraic sign bit of the number as a compressed sign bit.

16. The computer program storage medium of claim 13, the step for specifying the extraction bit position further comprising:

specifying a largest non-compressed number, wherein the largest non-compressed number is the absolute magnitude of the largest number in the range of compressible numbers;

identifying a smallest, non-zero non-compressed number, wherein within the range of compressible numbers the smallest, non-zero non-compressed number is the absolute magnitude of the smallest number which is non-zero;

subtracting the smallest, non-zero non-compressed number from the largest non-compressed number; and setting the extraction bit position equal to the bit position of the most significant bit which contains a one in the result of the method step of subtracting the smallest, non-zero non-compressed number from the largest non-compressed number.

17. The computer program storage medium of claim 13, the step for specifying the compression bias constant further comprising:

specifying a largest non-compressed number, wherein the largest non-compressed number is the absolute magnitude of the largest vector component in the range of compressible numbers;

specifying a compression rounding constant, wherein the compression rounding constant is comprised of the same number of bits as the number;

subtracting the compression rounding constant from the largest non-compressed number, wherein the subtracting step is performed in a manner that treats the compression rounding constant and the largest non-compressed number as though they were both fixed-point-format binary numbers; and in the compression bias constant, placing the result of the method step of subtracting the compression rounding constant from the largest non-compressed number.

18. The computer program storage medium of claim 17, the step specifying the compression rounding constant further comprising:

beginning with the extraction bit position in the compression rounding constant and extending toward the least significant bit, placing a one in each of the corresponding contiguous compressed representation field size bits; and placing zeros in all other bit positions of the compression rounding constant.

19. The computer program storage medium of claim 17, the step specifying the compression rounding constant further comprising:

beginning with the exaction bit position in the compression rounding constant and extending toward its least significant bit, placing a one in each of the corresponding contiguous compressed representation field size plus one bits; and placing zeros in all other bit positions of the compression rounding constant.

20. The computer program storage medium of claim 17, the step for specifying the compression rounding constant further comprising:

beginning with the extraction bit position in the compression rounding constant and extending to its least significant bit, placing a one in each of the corresponding contiguous bits; and placing zeros in all other bit positions of the compression rounding constant.

21. A computer system for creating and storing in a memory a compressed representation of a number, comprising:

a first arithmetic logic circuit configured to access data for accessing the number, wherein the number has values in a specified range of compressible numbers;

a second arithmetic logic circuit configured to take an absolute value of the number for, when the number is less than zero, taking an absolute value of the number;

a third arithmetic logic circuit configured to subtract one number from another for, when the number is less than zero, subtracting a specified compression bias constant from the absolute value of the number to obtain a difference value, wherein the subtraction is performed in a manner that treats the compression bias constant and the absolute value of the number as though they were both fixed-point-format binary numbers, otherwise, subtracting the compression bias constant from the number to obtain a difference value, wherein the subtraction is performed in a manner that treats the compression bias constant and the number as though they were both fixed-point-format binary numbers; and a fourth arithmetic logic circuit configured to copy data from one location in the memory to another for when the difference value is less than or equal to zero, copying zero into the compressed representation, otherwise, copying into the compressed representation a field of contiguous bits within the difference value, such that the number of bits in the field of contiguous bits is equal to a specified compressed representation field size, the bit position of the most significant bit in the field of contiguous bits corresponding to a specified extraction bit position in the difference value, and the most significant bit of the compressed representation corresponding to the most significant bit of the field of contiguous bits.

22. The computer system of claim 21, wherein the fourth arithmetic logic circuit configured to copy data is for further copying the algebraic sign bit of the number as a compressed sign bit.

23. The computer system of claim 21 wherein:

the third arithmetic logic circuit configured to subtract is for further subtracting a smallest, non-zero non-compressed number from a largest non-compressed number, wherein within the range of compressible numbers the smallest, non-zero non-compressed number is the absolute magnitude of the smallest number which is non-zero and wherein the largest non-compressed number is the absolute magnitude of the largest number in the range of compressible numbers; and the fourth arithmetic logic circuit configured to copy data is for further copying the bit position number of the most significant bit which contains a one in the result of the subtraction of the smallest, non-zero non-compressed number from the largest non-compressed number into the extraction bit position.

24. The computer system of claim 21 wherein:

the third arithmetic logic circuit configured to subtract is for further subtracting a specified compression rounding constant from a largest non-compressed number, wherein the compression rounding constant is comprised of the same number of bits as the number, wherein the largest non-compressed number is the absolute magnitude of the largest number in the range of compressible numbers, and wherein the subtraction is performed in a manner that treats the compression rounding constant and the largest non-compressed number as though they were both fixed-point-format binary numbers; and the fourth arithmetic logic circuit configured to copy data is for further copying the result of the subtraction of the compression rounding constant from the largest non-compressed number into the compression bias constant.

25. The computer system of claim 24, wherein:

the fourth arithmetic logic circuit configured to copy data is for further copying, beginning with the extraction bit position in the compression rounding constant and extending toward the least significant bit, a one into each of the corresponding contiguous compressed representation field size bits; and the fourth arithmetic logic circuit configured to copy data is for further copying zeros into all other bit positions of the compression rounding constant.

26. The computer system of claim 24, wherein:

the fourth arithmetic logic circuit configured to copy data is for further copying, beginning with the extraction bit position in the compression rounding constant and extending toward its least significant bit, a one into each of the corresponding contiguous compressed representation field size plus one bits; and the fourth arithmetic logic circuit configured to copy data is for further copying zeros into all other bit positions of the compression rounding constant.

27. The computer system of claim 24, wherein:

the fourth arithmetic logic circuit configured to copy data is for further copying, beginning with the extraction bit position in the compression rounding constant and extending to its least significant bit, a one into each of the corresponding contiguous bits; and the fourth arithmetic logic circuit configured to copy data is for further copying zeros into all other bit positions of the compression rounding constant.

* * * * *